United States Patent
Jones et al.

(10) Patent No.: US 6,927,125 B2
(45) Date of Patent: Aug. 9, 2005

(54) INTERDIGITATED CAPACITOR AND METHOD OF MANUFACTURING THEREOF

(75) Inventors: Christopher D. W. Jones, New Providence, NJ (US); Donald W. Murphy, Davis, CA (US); Yiu-Huen Wong, Summit, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/776,752

(22) Filed: Feb. 11, 2004

(65) Prior Publication Data

US 2004/0159862 A1 Aug. 19, 2004

Related U.S. Application Data

(62) Division of application No. 09/929,188, filed on Aug. 14, 2001, now Pat. No. 6,740,922.

(51) Int. Cl.⁷ ......................................... H01L 21/8242
(52) U.S. Cl. ....................................... 438/253; 438/396
(58) Field of Search ................................ 438/239, 240, 438/253, 256, 396, 399

(56) References Cited

U.S. PATENT DOCUMENTS

| 4,409,608 A | 10/1983 | Yoder |
| 5,393,373 A | 2/1995 | Jun et al. |
| 5,527,730 A | * 6/1996 | Kayaoka et al. ............ 438/256 |
| 5,744,853 A | * 4/1998 | Quek et al. .................. 257/532 |
| 6,150,706 A | 11/2000 | Thakur et al. |
| 6,383,858 B1 | 5/2002 | Gupta et al. |
| 6,436,787 B1 | 8/2002 | Shih et al. |

OTHER PUBLICATIONS

Parent U.S. Appl. No. 09/929,188 filed Aug. 14, 2001 to Christopher DW Jones, et al, entitled "Interdigitated Capacitor and Method of Manufacturing Thereof"; allowed Jan. 5, 2004.

* cited by examiner

*Primary Examiner*—Hoai Pham

(57) ABSTRACT

The present invention provides a method of manufacturing an interdigitated semiconductor device. In one embodiment, the method comprises simultaneously forming first electrodes adjacent each other on a substrate, forming a dielectric layer between the first electrodes, and creating a second electrode between the first electrodes, the second electrode contacting the dielectric layer between the first electrodes to thereby form adjacent interdigitated electrodes. An interdigitated capacitor and a method of manufacturing an integrated circuit having an interdigitated capacitor are also disclosed.

12 Claims, 5 Drawing Sheets

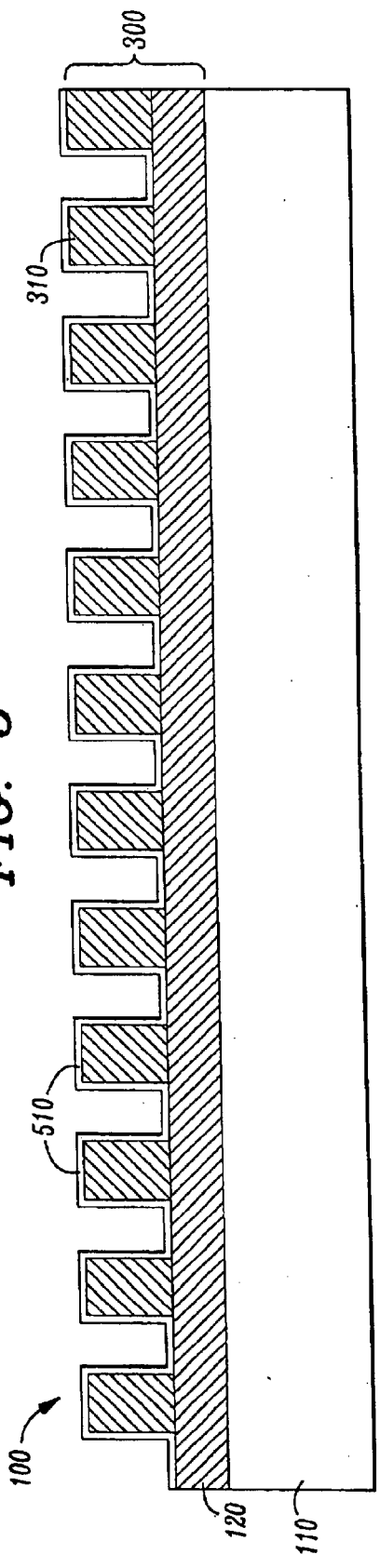
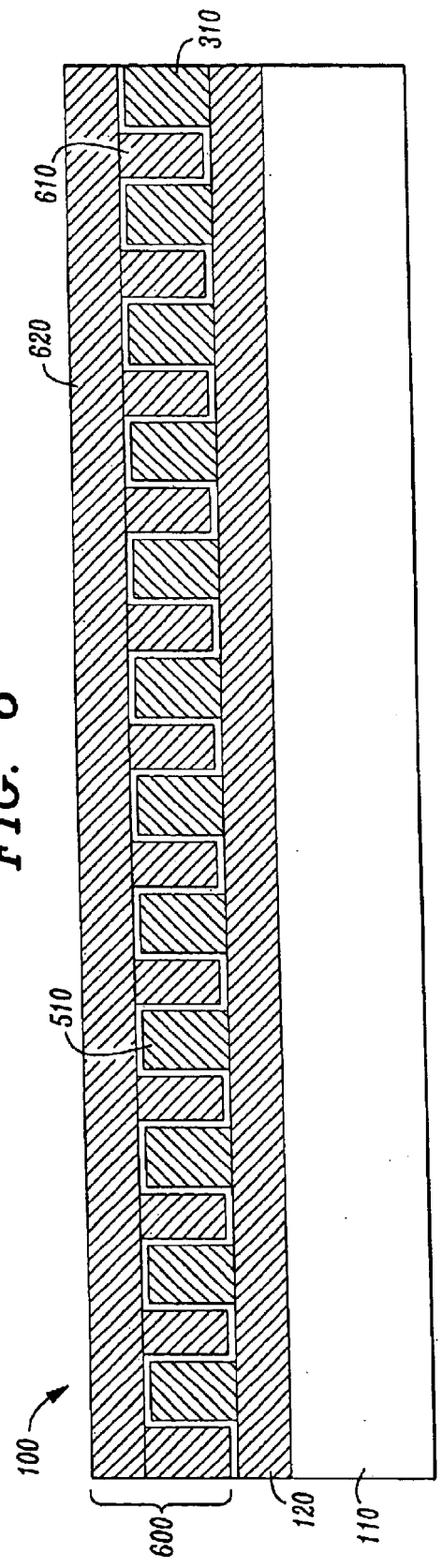

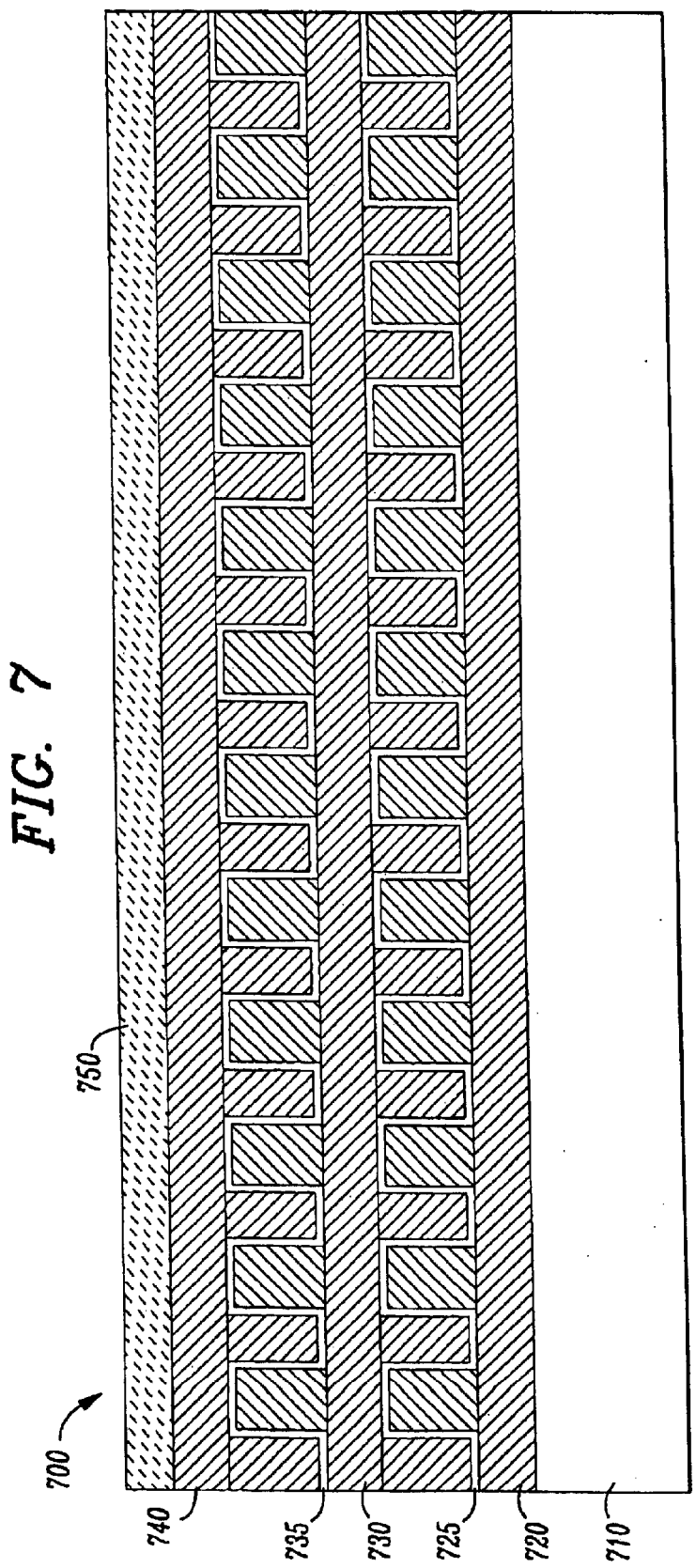

INTERDIGITATED CAPACITOR AND METHOD OF MANUFACTURING THEREOF

This Application is a Divisional of prior application Ser. No. 09/929,188 filed on Aug. 14, 2001, now U.S. Pat. No. 6,740,922, to Christopher D. W. Jones, et al. The above-listed Application is commonly assigned with the present invention and is incorporated herein by reference as if reproduced herein in its entirety under Rule 1.53(b).

TECHNICAL FIELD OF THE INVENTION

Background of the Invention

As is well known, various semiconductor devices and structures are fabricated on semiconductor wafers in order to form operative integrated circuits (ICs). These various semiconductor devices and structures allow fast, reliable and inexpensive ICs to be manufactured for today's competitive computer and telecommunication markets. To keep such ICs inexpensive, the semiconductor manufacturing industry continually strives to economize each step of the IC fabrication process to the greatest extent, while maintaining the highest degree of quality and functionality as possible.

Integrated circuits in general have continued to gain wide spread usage as user demands for increased functionality and enhanced benefits continues to rise. In order to meet this demand, the integrated circuit industry continues to decrease the size of circuit structures in order to place more circuits in the same size integrated circuit area, thereby continually increasing the packing density for a given chip size. Over the last several years, structures have gone from 1.2 micron gate areas (1 Meg. Capacity) down to gate structure areas of 0.12 microns (1 Gbit capacity), and promise to become even smaller in the near future. Other devices that are steadily decreasing in size are semiconductor capacitors. However, since the capacitance of such capacitors depends somewhat on the surface area of their electrodes, decreasing the size of these capacitors is hampered by the need for a high surface area.

Thus, as the demand for higher quality yet smaller devices continues to grow, the use of different methods for manufacturing semiconductor capacitors has reached phenomenal proportions. Among the primary goals of these newer methods is the increase of the surface area of the electrodes of the capacitor, while maintaining the same, or even smaller, capacitor footprint. Those skilled in the art understand that as the surface area of the capacitor increases within a given footprint, so too does the overall capacitance provided by the device. Conversely, the overall size of a capacitor may be decreased, while maintaining the same or higher capacitance, if the surface area of the capacitor is proportionally increased.

At first glance, an obvious solution to manufacturing capacitors with increased electrode surface areas would be to simply increase the number of layers in capacitors while decreasing layer thickness. An example of such an approach may be a multi-layer ceramic capacitor (MLCC). However, to accommodate desired capacitances, numerous thin-film layers are required to arrive at the necessary surface area. Unfortunately, in addition to the increased risk of layer defects, as capacitor films become thinner they operate closer to the breakdown point of the layer. Thus, capacitors manufactured with such thin films, such as electrolytic capacitors, typically employ "healing electrodes" to repair some of the leakage problems that eventually develop. However, those skilled in the art understand that healing electrodes have relatively poor conductivity, making electrolytic capacitors a poor choice for high frequency (e.g., >1 Mhz) applications.

Moreover, even if capacitor layer thickness were further reduced, without the adverse consequences discussed above, forming an increased number of layers, for example in an MLCC, results in increased manufacturing steps, which translates into increased manufacturing costs. With the already high cost of semiconductor manufacturing, as well as a market already filled with intense competition, semiconductor manufacturers must make every effort to streamline the manufacturing process rather than increase the cost.

Accordingly, what is needed in the art is an improved semiconductor capacitor having an increased surface area, and a method of manufacturing thereof, that does not suffer from the deficiencies found in the prior art.

SUMMARY OF THE INVENTION

To address the above-discussed deficiencies of the prior art, the present invention provides a method of forming an interdigitated semiconductor device. In one embodiment, the method comprises simultaneously forming first electrodes adjacent each other on a substrate, forming a dielectric layer between the first electrodes, and creating a second electrode between the first electrodes. In this embodiment, the second electrode contacts the dielectric layer between the first electrodes to thereby form adjacent interdigitated electrodes.

In another aspect of the present invention, the method includes producing a first conductive layer over the substrate prior to simultaneously form the first electrodes, and simultaneously form the first electrodes on the first conductive layer. In such an embodiment, the conductive layer interconnects the adjacent first electrodes. In a related embodiment, the dielectric layer is formed over and between the first electrodes, and the second electrode is formed by creating an electrode layer over and between the first electrodes to form interconnected second electrodes over and between the first electrodes.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. Reference is now made to the following descriptions taken in conjunction with the accompanying drawings, in which:

FIG. 5 illustrates a sectional view of the device of FIG. 4 subsequent to the deposition of a dielectric material;

FIG. 6 illustrates a sectional view of the device of FIG. 5 subsequent to the deposition of a conductive material;

FIG. 7 illustrates one embodiment of a completed interdigitated capacitor manufactured according to the principles of the present invention;

DETAILED DESCRIPTION

Figure 1:
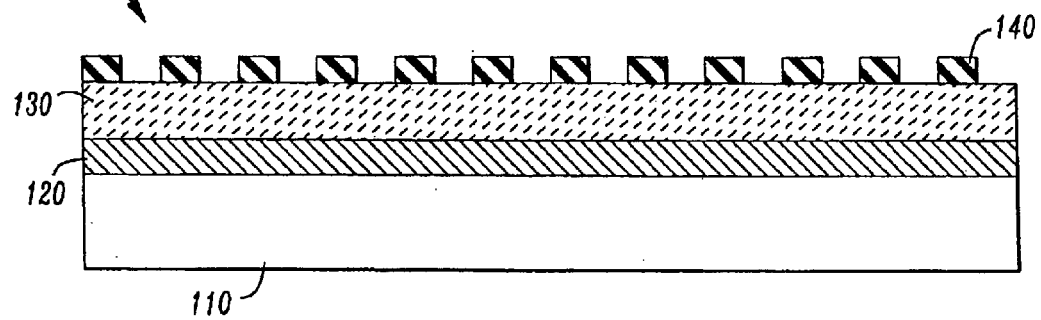
FIG. 1 illustrates a sectional view of an initial device from which an interdigitated capacitor as provided by the present invention may be formed.

Referring initially to FIG. 1, illustrated is a sectional view of an initial device 100 from which an interdigitated capacitor as provided by the present invention may be formed. The device 100 is formed on a semiconductor substrate 110, which may be comprised of silicon. Deposited on top of the substrate 110 is a first conductive layer 120. In an advantageous embodiment of the present invention, the first conductive layer 120 may be copper. Of course, the first conductive layer 120 may be comprised of any suitable conductor, and the present invention is not limited to any particular conductive material.

On top of the first conductive layer 120, a sacrificial layer 130 is deposited. In one embodiment the sacrificial layer 130 may be silicon dioxide ($SiO_2$), however any suitable material may be used. A mask 140, such as a photoresist layer, is then deposited atop the sacrificial layer 130 and patterned, preferably using conventional photolithographic techniques. The patterned mask 140 is used to define the shape of the first electrode of the capacitor, as will be described in greater detail below.

Figure 2:
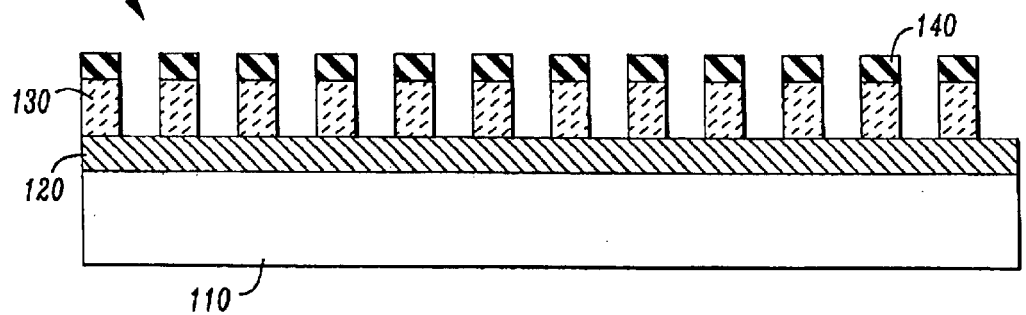
FIG. 2 illustrates a sectional view of the device of FIG. 1 after etching of the sacrificial layer.

Turning now to FIG. 2, illustrated is a sectional view of the device 100 of FIG. 1 after the etching of the sacrificial layer. As illustrated, the sacrificial layer 130 is etched, using conventional etching techniques, until the first conductive layer 120 is partially revealed through trenches etched into the sacrificial layer 130. In accordance with the present invention, the sacrificial layer 130 is etched following the pattern formed with the mask 140, as described above.

Figure 3:
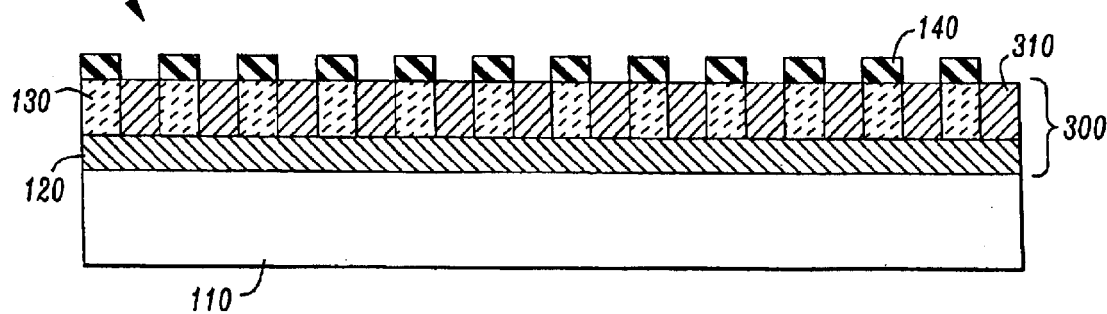
FIG. 3 illustrates a sectional view of the device of FIG. 2 subsequent to the deposition of first electrodes.

Turning to FIG. 3, illustrated is a sectional view of the device 100 of FIG. 2 subsequent to the deposition of first electrodes 310. The first electrodes 310 are simultaneously formed in the trenches etched into the sacrificial layer 130. In an exemplary embodiment, the first electrodes 310 are simultaneously formed from the same material forming the first conductive layer 120. Of course, the two materials may be different conductors without departing from the broad scope of the present invention. In the illustrated embodiment, the first electrodes 310 and the first conductive layer 120 combine to form the first electrode 300 of the device 100. However, it should be understood that in other embodiments the first conductive layer 120 may not be present.

In an advantageous embodiment, the first electrodes 310 are simultaneously deposited having an aspect ratio ranging from about 7:1 to about 10:1. As used herein, the term "aspect ratio" is defined as the height of an object in proportion to its width. For instance, in the advantageous embodiment just mentioned, the height of each of the first electrodes 310 ranges from about 7 to 10 times its width. In a more specific embodiment, the aspect ratio of the first electrodes 310 may be about 8:1.

In addition, in an exemplary embodiment, the first electrodes 310 are deposited to a thickness ranging from about 1.2 microns to about 2.0 microns. In such an embodiment, the first electrodes 310 would have a width of about 0.12 microns to about 0.2 microns, respectively. In a more specific embodiment, the first electrodes 310 are deposited to a thickness of about 1.5 microns, with each first electrode having a width of about 0.15 microns. However, it must be understood that the actual dimensions of the first electrodes 310 are independent of the aspect ratios of the individual first electrodes. For instance, the first electrodes 310 may be deposited such that each first electrode has a height of about 8 microns and a width of about 1 micron, rather than only a height of 1.5 microns and a width of 0.15 microns, while still maintaining an advantageous 8:1 aspect ratio.

Figure 4:
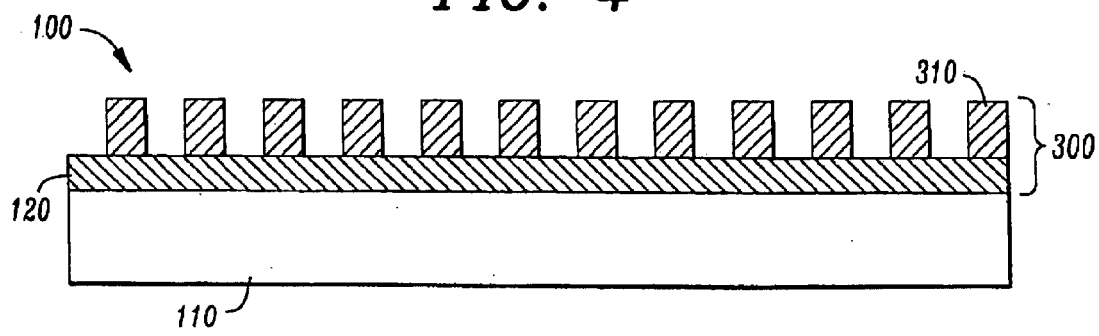
FIG. 4 illustrates a sectional view of the device of FIG. 3 after removal of the sacrificial layer and mask.

Referring to FIG. 4, illustrated is a sectional view of the device 100 of FIG. 3 after removal of the sacrificial layer 130 and mask 140. More specifically, in accordance with the present invention, the sacrificial layer 130 and the mask 140 are removed from the device 100 using conventional techniques. Those skilled in the art are familiar with such conventional removal techniques so the details of those techniques will not be discussed herein. The removal process gives the first electrodes 310 their final dimensions, by removing the mask 140 and removing the sacrificial layer 130 from in between them.

It must be noted that the method of manufacturing an interdigitated capacitor according to the present invention is not limited to the method described with respect to FIGS. 1 through 4. Specifically, in an alternative embodiment, the first conductive layer 120 may be deposited to a thickness substantially equal to the thickness of both the first conductive layer 120 and the first electrodes 310 illustrated in FIG. 4. Then, rather than depositing the sacrificial layer 130, the mask 140 may be applied to the first conductive layer 120 in a pattern similar to that illustrated in FIG. 1. An etchant may then be used to remove material from the first conductive layer 120 to form the first electrodes 310. After etching the first conductive layer 120, the resulting structure would then comprise the first electrode 300. The advantages to the manufacturing process provided by the present invention remain no matter which method of manufacturing, or methods of forming the individual layers, is used since the first electrodes 310 are still formed simultaneously and the increased capacitor surface area discussed above is provided. Those skilled in the art understand the importance of constructing such a discrete capacitor.

Looking now at FIG. 5, illustrated is a sectional view of the device 100 of FIG. 4 subsequent to the deposition of a dielectric material. As illustrated, a dielectric layer 510 is deposited over and in between the first electrodes 310 and the first conductive layer 120. In an exemplary embodiment, the dielectric layer 510 is deposited to a thickness of about 300 nm. However, in an advantageous embodiment, the dielectric layer 510 is deposited to a thickness of only about 100 nm, thus increasing the capacitance per unit area of the device 100.

In one embodiment of the present invention, the dielectric layer 510 is comprised of barium strontium titanate ($Ba_xSr_{1-}$ $_x$TiO$_3$, "BST"). In such an embodiment, the BST may be deposited using a chemical vapor deposition (CVD) process or a physical vapor deposition (PVD) process, however the present invention is not so limited. In other embodiments, the dielectric layer 510 may also be comprised of other materials, suitable for use as the dielectric of a capacitor. Moreover, the use of dielectrics having a high dielectric constant ("high-K") may further increase the capacitance of the device 100, above that gained from the increased surface area of the dielectric layer 510 provided by the present invention. Examples of possible high-K dielectrics which may be used with the present invention includes, for instance, tantalum pentoxide, lead zirconium titanate, silicon nitride or aluminum oxide.

Turning to FIG. 6, illustrated is a sectional view of the device 100 of FIG. 5 subsequent to the deposition of a conductive material. At this point, the device 100 is completed by depositing a second electrode 600 over the dielectric layer 510. As the second electrode 600 is deposited, the spaces present between the first electrodes 310 are simultaneously filled with second electrodes 610. As illustrated, the second electrodes 610 protrude from a second conductive layer 620.

As with the first electrodes 310 described above, in an exemplary embodiment, the second electrodes 610 may be formed with an aspect ratio ranging from about 7:1 to 10:1. In addition, the second conductive layer 620 and second electrodes 610 may be manufactured from the same material as the first conductive layer 120 and first electrodes 310. For example, both electrodes 300, 600 may be formed from copper or even platinum, however any conductor suitable for use as an electrode may be used in the device 100. Alternatively, the first and second electrodes 300, 600 may be formed from different materials. In addition, if desired, the first electrodes 310 may be formed from a material different than the first conductive layer 120, while the second electrodes 610 may be formed from a material different than the second conductive layer 620. The selection of material(s) is a matter of design choice, perhaps depending on the application, however the present invention is not limited to the use of any particular conductive material(s).

In an alternative embodiment, the device 100 need not include the first conductive layer 120 or the second conductive layer 620. Instead, the device 100 may simply be manufactured using the first electrodes 310 and the second electrodes 610 separated by the dielectric layer 510. In this exemplary embodiment, the first electrodes 310 and the second electrodes 610 cooperate to form multiple interdigitated electrodes which act as multiple capacitors located within the device 100. Of course, the present invention may be embodied in either structure since the first electrodes 310 and the second electrodes 610 are each still manufactured simultaneously.

By forming the first electrodes 310 and the second electrodes 610 in accordance with the present invention, the interdigitated capacitor device 100 illustrated in FIG. 6 provides for a substantially greater surface area for the dielectric layer 510 than provided by capacitors found in the prior art. Those skilled in the art understand that as the surface area of the electrodes of a capacitor is increased, the capacitance of that capacitor is also increased. Thus, by increasing the surface area, the discrete interdigitated capacitor manufactured according to the present invention has a substantially greater capacitance than capacitors found in the prior art. In addition, this increased capacitance may be achieved without increasing the footprint or the overall size of the capacitor. For example, for a given footprint where a prior art capacitor may require multiple layers to achieve a certain capacitance, thus resulting in a "taller" capacitor than may be desirable, a capacitor manufactured according to the present invention may provide an equivalent capacitance within substantially the same footprint and height of a single-layer prior art capacitor.

Moreover, the capacitance of a capacitor according to the present invention may be further increased by increasing the aspect ratio of the first electrodes 310 and the second electrodes 610. In such an embodiment, as the aspect ratio increases, so too does the surface area of the corresponding first electrodes 310 and second electrodes 610, and consequently the first and second electrodes 300, 600. As a result, the capacitance provided across this increased surface area also increases. For example, the aspect ratio may be increased to about 20:1. Although the resulting device would stand much taller than the embodiments described above, the capacitance gained from the further increase in surface area may outweigh the excess height of the device, depending on the desired application (for instance, if there was limited lateral surface area but ample vertical space in the integrated circuit being manufactured).

Furthermore, the capacitance of an interdigitated capacitor of the present invention may be even further increased by employing high-K dielectrics for use as the dielectric layer 510. Those skilled in the art understand the benefits of employing dielectrics having high dielectric constants in the manufacture of semiconductor capacitors. Among the high-K dielectrics that may be used are the BST described above, tantalum pentoxide, lead zirconium titanate, silicon nitride or an aluminum oxide. Of course, a capacitor need not be manufactured with a high-K dielectric layer to fall within the broad scope of the present invention.

Referring now to FIG. 7, illustrated is one embodiment of a completed interdigitated capacitor 700 manufactured according to the principles of the present invention. In the illustrated embodiment, the capacitor 700 includes multiple layers to further increase the overall capacitance of the device, as discussed above. As before, the capacitor 700 is formed on a substrate 710, which may comprise silicon or other suitable material.

Over the substrate 710, first, second and third electrodes 720, 730, 740 are formed. Each electrode 720, 730, 740 is comprised of first electrodes formed on a first conductive layer, as well as corresponding second electrodes formed on a second conductive layer, in accordance with the structures described above. In between these electrodes 720, 730, 740, first and second dielectric layers 725, 735 are formed. A dielectric housing 750 is also illustrated over the capacitor 700 to electrically insulate it from the surrounding environment. Etching, or other conventional techniques, may then be used to give the capacitor 700 a desired shape within an integrated circuit. Although only three electrodes 720, 730, 740 are illustrated in FIG. 7, the present invention is not limited to any particular number of electrodes.

Figure 8:
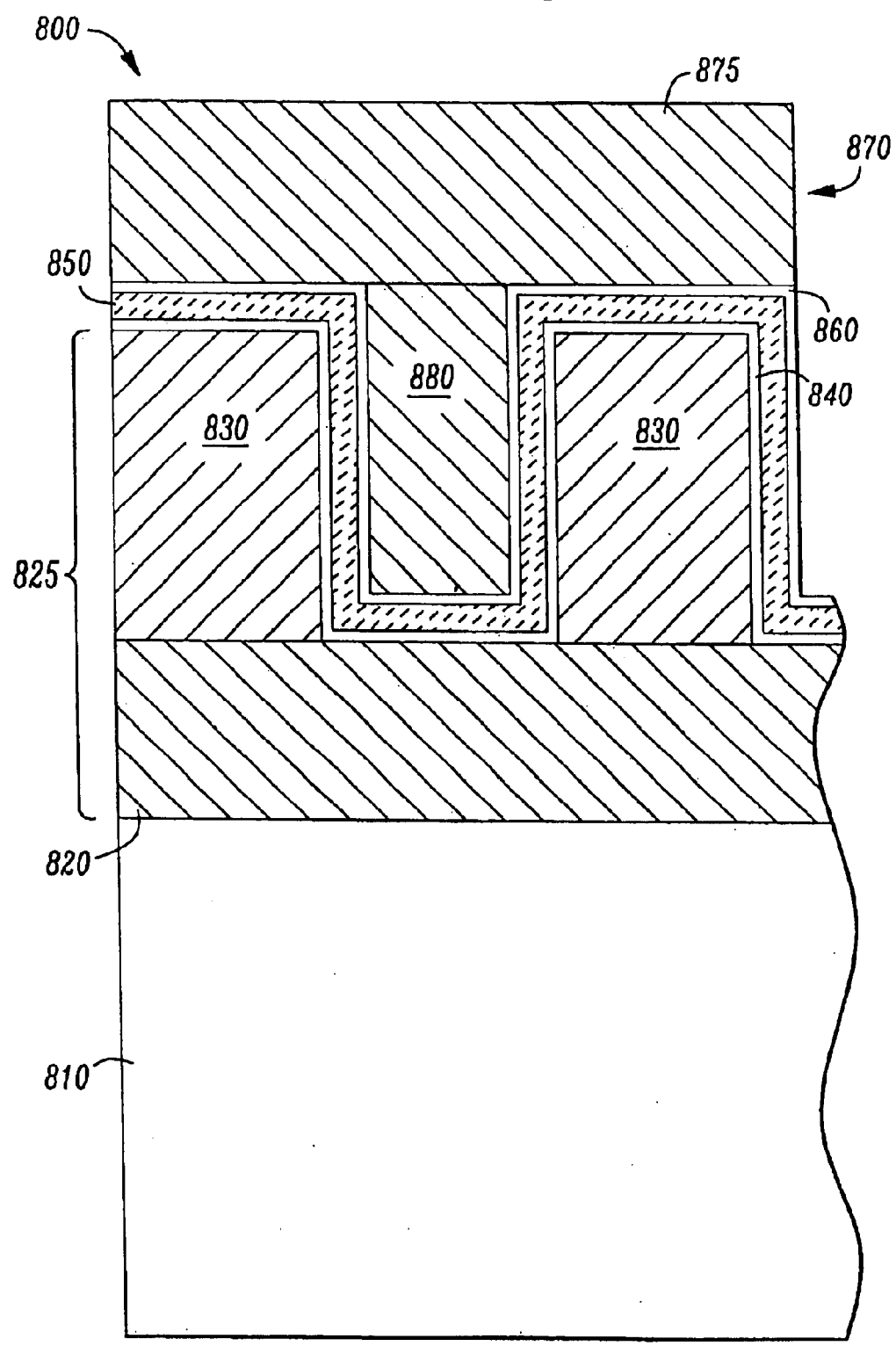
FIG. 8 illustrates a close-up sectional view of another embodiment of an interdigitated capacitor manufactured according to the principles of the present invention.

Looking now at FIG. 8, illustrated is a close-up sectional view of another embodiment of an interdigitated capacitor 800 manufactured according to the principles of the present invention. In the illustrated embodiment, the capacitor 800 is again formed on a substrate 810 of a semiconductor wafer.

Similar to the embodiments described above, a first conductive layer 820 is formed on the substrate 810. Also as before, the first conductive layer 820 may be formed from copper, platinum, titanium, or other suitable material. Using one embodiment of the method of the present invention, first electrodes 830 are simultaneously formed in contact with the first conductive layer 820, and together form a first electrode 825. The aspect ratio of the first electrodes 830 may follow those aspect ratios discussed above, however any aspect ratio may be used depending on the desired increase in surface area of the capacitor 800.

After the first electrodes 830 have been simultaneously formed, a first barrier layer 840 is then deposited over the first conductive layer 820 and between the first electrodes 830. In an exemplary embodiment, the material used for the first barrier layer 840 may be selected depending on the material used for the first conductive layer 820 and its first electrodes 830, as well as the material selected for a dielectric layer 850 deposited over and between the first barrier layer 840. For example, if the first conductive layer 820 and the first electrodes 830 are formed from copper (Cu), and the dielectric layer 850 is formed by depositing silicon dioxide ($SiO_2$), those skilled in the art understand that the copper may negatively react with the $SiO_2$ and detrimentally affect performance of the capacitor 800. In such an embodiment, the first barrier layer 840 may be formed from ruthenium (Ru) to prevent such an adverse reaction. Of course, other materials such as titanium nitride (TiN), tantalum nitride (TaN), or tungsten nitride (WN) may be selected for the first barrier layer 840 depending on the materials selected for the first electrode 825 and the dielectric layer 850.

A second barrier layer 860 is then deposited over the dielectric layer 850. Then, over the second barrier layer 860, a second electrode 870 is formed. Like the first electrode 825, the second electrode 870 has a second conductive layer 875 as well as second electrodes 880. However, as illustrated, the second electrodes 880 protrude downwards against the second barrier layer 860 and between the first electrodes 830. As with the selection of the material for the first barrier layer 840, the material for the second barrier layer 860 will depend on the material used to form the second conductive layer 875 and the second electrodes 880. As before, the present invention is not limited to any particular material, and any suitable materials may be employed for the various layers of the interdigitated capacitor 800.

In accordance with the principles of the present invention, the capacitor 800 illustrated in FIG. 8 provides increased capacitance over capacitors found in the prior art due to the increase in surface area within a given footprint, while also providing the protection of the barrier layers. In addition, like the interdigitated capacitor 700 of FIG. 7, the capacitor 800 of FIG. 8 may also include multiple layers to further increase the capacitor's 800 surface area, and therefore its overall capacitance.

Figure 9:
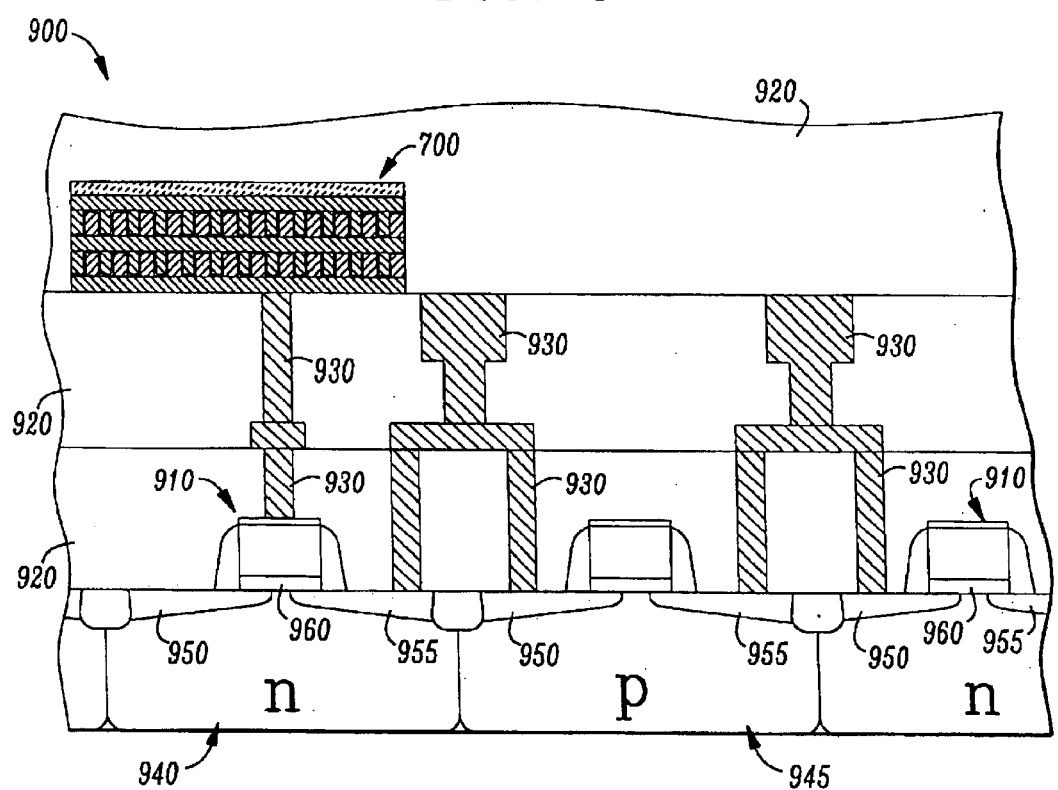
FIG. 9 illustrates a sectional view of a conventional integrated circuit incorporating the completed interdigitated capacitor illustrated in FIG. 7.

Turning finally to FIG. 9, illustrated is a sectional view of a conventional integrated circuit (IC) 900 incorporating the completed interdigitated capacitor 700 illustrated in FIG. 7. The IC 900 may include active devices, such as transistors, used to form CMOS devices, BiCMOS devices, Bipolar devices, or other types of active devices. The IC 900 may further include passive devices such as inductors or resistors, or it may also include optical devices or optoelectronic devices. Those skilled in the art are familiar with these various types of device and their manufacture.

In the embodiment illustrated in FIG. 9, components of the conventional IC 900 include transistors 910, having gate oxide layers 960, formed on a semiconductor wafer. The transistors 910 may be metal-oxide semiconductor field effect transistors (MOSFETs) 910, however other types of transistors are within the scope of the present invention. Interlevel dielectric layers 920 are then shown deposited over the transistors 910.

The capacitor 700 is formed over the interlevel dielectric layers 920, in accordance with the principles of forming a capacitor described above. Interconnect structures 930 are formed in the interlevel dielectric layers 920 to form interconnections between the transistors 910 and the capacitor 700 to form an operative integrated circuit. Also illustrated are conventionally formed tubs 940, 945, source regions 950, and drain regions 955.

Also in the illustrated embodiment, one of the interconnect structures 930 is shown connecting one of the transistors 910 to the capacitor 700. In addition, the interconnect structures 930 also connect the transistors 910 to other areas or components of the IC 900. Those skilled in the art understand how to connect these various devices together to form an operative integrated circuit.

Of course, use of the method of manufacturing capacitors of the present invention is not limited to the manufacture of the particular IC 900 illustrated in FIG. 9. In fact, the present invention is broad enough to encompass the manufacture of any type of integrated circuit formed on a semiconductor wafer which would benefit from the increased capacitance of interdigitated capacitors located therein, as provided by the present invention. Furthermore, since some or all of the layers of a capacitor manufactured according to the present invention may be formed using conventional techniques, capacitors of the present invention may be easily integrated with many IC manufacturing technologies. In addition, the present invention is broad enough to encompass integrated circuits having greater or fewer components than illustrated in the IC 900 of FIG. 9. Beneficially, each time the method of the present invention is employed to form part or all of a semiconductor capacitor, manufacturing costs may be eliminated from the entire manufacturing process due to the reduced number of capacitor layers needed within a given footprint, as well as the increase in capacitance of those layers that are manufactured.

Although the present invention has been described in detail, those skilled in the art should understand that they can make various changes, substitutions and alterations herein without departing from the spirit and scope of the invention in its broadest form.

What is claimed is:

1. A method of forming a semiconductor device, comprising:
    simultaneously forming first electrodes adjacent each other on a substrate, the first electrodes comprising a metal, including patterning a sacrificial layer on the substrate, forming the first electrodes adjacent each other within the patterned sacrificial layer and on the substrate, and removing the sacrificial layer;
    forming a dielectric layer between the first electrodes; and
    creating a second electrode comprising the metal between the first electrodes, the second electrode contacting the dielectric layer between the first electrodes to thereby form adjacent interdigitated electrodes.

2. The method as recited in claim 1 further including producing a first conductive layer over the substrate prior to simultaneously forming and wherein simultaneously forming includes simultaneously forming the first electrodes on the first conductive layer, the conductive layer interconnecting the first electrodes.

3. The method as recited in claim 2 wherein forming a dielectric layer includes forming the dielectric layer over and between the first electrodes and creating a second electrode includes creating an electrode layer over and between the first electrodes to form interconnected second electrodes over and between the first electrodes.

4. A method of forming a semiconductor device, comprising:
 producing a first conductive layer over a substrate prior to simultaneously forming first electrodes adjacent each other on a substrate, the first electrodes comprising a metal, wherein simultaneously forming includes patterning a sacrificial layer on the substrate, forming the first electrodes adjacent each other within the patterned sacrificial layer and on the substrate, and removing the sacrificial layer;
 forming a dielectric layer between the first electrodes; and
 creating a second electrode comprising the metal between the first electrodes, the second electrode contacting the dielectric layer between the first electrodes to thereby form adjacent interdigitated electrodes.

5. The method as recited in claim 1 further including forming a first barrier layer between the first electrodes prior to forming the dielectric layer between the first electrodes and forming a second barrier layer between the first electrodes prior to creating a second electrode between the first electrodes, the second electrode contacting the barrier layer between the first electrodes.

6. The method as recited in claim 1 wherein simultaneously forming includes simultaneously forming first electrodes having an aspect ratio ranging from about 7:1 to 10:1 adjacent each other on a substrate.

7. A method of manufacturing an integrated circuit, comprising:
 forming active or passive devices over a substrate;
 creating an interdigitated capacitor over the substrate, including:
  placing a first conductive layer over the substrate,
  simultaneously forming first electrodes adjacent each other on the first conductive layer, the conductive layer interconnecting the first electrodes, the first electrodes and the conductive layer comprising a metal, wherein simultaneously forming includes patterning a sacrificial layer on the substrate, forming the first electrodes adjacent each other within the patterned sacrificial layer and on the substrate, and removing the sacrificial layer,
  forming a dielectric layer over and between the first electrodes and on the first conductive layer, and
  depositing an electrode layer over and between the first electrodes to form interconnected second electrodes over and between the first electrodes, the second electrodes comprising the metal; and
 interconnecting the active or passive devices and the interdigitated capacitor to form an operative integrated circuit.

8. The method as recited in claim 7 further including forming a first barrier layer between the first electrodes prior to forming the dielectric layer over and between the first electrodes and on the first conductive layer and forming a second barrier layer between the first electrodes prior to depositing an electrode layer over and between the first electrodes to form interconnected second electrodes over and between the first electrodes, to electrode layer contacting the second barrier layer.

9. The method as recited in claim 7 wherein simultaneously forming includes simultaneously forming first electrodes having an aspect ratio ranging from about 7:1 to 10:1 adjacent each other on a substrate.

10. The method as recited in claim 7 wherein forming a dielectric layer includes forming a dielectric layer having a high dielectric constant.

11. The method as recited in claim 7 wherein creating an interdigitated capacitor includes creating an interdigitated capacitor wherein the first electrodes and the first conductive layer are comprised of substantially the same material.

12. The method as recited in claim 7 wherein creating an interdigitated capacitor includes creating an interdigitated capacitor wherein the first electrodes, the first conductive layer, and the electrode layer are comprised of substantially the same material.

* * * * *